(12) United States Patent
Gerhaeusser et al.

(10) Patent No.: US 9,642,266 B2
(45) Date of Patent: May 2, 2017

(54) ELECTRONIC MODULE FOR OPERATION IN A TRANSMISSION

(75) Inventors: Martin Gerhaeusser, Brackenheim-Stockheim (DE); Martin Kowatsch, Freudental (DE)

(73) Assignee: Robert Bosch GmbH, Stuttgart (DE)

( * ) Notice: Subject to any disclaimer, the term of this patent is extended or adjusted under 35 U.S.C. 154(b) by 17 days.

(21) Appl. No.: 14/352,392

(22) PCT Filed: Sep. 4, 2012

(86) PCT No.: PCT/EP2012/067164
§ 371 (c)(1),
(2), (4) Date: Nov. 4, 2014

(87) PCT Pub. No.: WO2013/064285
PCT Pub. Date: May 10, 2013

(65) Prior Publication Data
US 2015/0096800 A1    Apr. 9, 2015

(30) Foreign Application Priority Data
Nov. 2, 2011  (DE) ........................ 10 2011 085 629

(51) Int. Cl.
| | | |
|---|---|---|
| *H05K 5/06* | (2006.01) | |
| *H05K 5/04* | (2006.01) | |
| *H05K 5/00* | (2006.01) | |
| *F16H 61/00* | (2006.01) | |
| *H05K 5/02* | (2006.01) | |

(52) U.S. Cl.
CPC ....... *H05K 5/0082* (2013.01); *F16H 61/0006* (2013.01); *H05K 5/0204* (2013.01); *H05K 5/064* (2013.01)

(58) Field of Classification Search
CPC ............................ H05K 5/0082; H05K 5/064
USPC ......................................................... 174/521
See application file for complete search history.

(56) References Cited

U.S. PATENT DOCUMENTS 5,444,297 A * 8/1995 Oshima ............... H01L 23/5383
257/660
5,465,481 A * 11/1995 Romero .................. H01L 23/04
174/535

(Continued)

FOREIGN PATENT DOCUMENTS

DE         103 40 974         3/2005
DE   10 2007 019 096 A1    11/2008
(Continued)

OTHER PUBLICATIONS

International Search Report corresponding to PCT Application No. PCT/EP2012/067164, mailed Apr. 4, 2013 (German and English language document) (7 pages).

*Primary Examiner* — Hung V Ngo
(74) *Attorney, Agent, or Firm* — Maginot, Moore & Beck LLP (57) ABSTRACT

An electronic module for a vehicle includes a can housing and a circuit carrier having at least one connecting element. The circuit carrier is positioned in the can housing, and is cast with a cast material. The at least one connecting element protrudes from the cast material and is configured to connect at least one conductive element. The electronic module is positioned in the transmission and is configured to be operated.

9 Claims, 6 Drawing Sheets

(56) References Cited

U.S. PATENT DOCUMENTS

| | | | |
|---|---|---|---|
| 5,519,252 A * | 5/1996 | Soyano | H01L 21/56 257/177 |
| 5,909,915 A | 6/1999 | Okuda | |
| 6,201,696 B1 * | 3/2001 | Shimizu | H01L 23/24 165/80.2 |
| 6,307,749 B1 * | 10/2001 | Daanen | H05K 3/284 174/50.5 |
| 6,967,849 B1 * | 11/2005 | Hwang | H05K 5/0026 361/752 |
| 7,782,628 B2 * | 8/2010 | Sakamoto | H05K 1/144 174/521 |
| 2005/0198819 A1 * | 9/2005 | Hunkeler | H05K 3/284 29/841 |
| 2010/0149763 A1 * | 6/2010 | Wetzel | H05K 5/0082 361/749 |
| 2011/0044005 A1 * | 2/2011 | Wetzel | H05K 5/0082 361/714 |
| 2011/0205701 A1 | 8/2011 | Kanzaki | |
| 2012/0057313 A1 * | 3/2012 | Darbinyan | H05K 5/064 361/752 |

FOREIGN PATENT DOCUMENTS

| | | |
|---|---|---|
| DE | 10 2007 029 913 A1 | 1/2009 |
| DE | 10 2007 045 511 A1 | 4/2009 |
| EP | 2 211 598 A2 | 7/2010 |

* cited by examiner

ELECTRONIC MODULE FOR OPERATION IN A TRANSMISSION

This application is a 35 U.S.C. §371 National Stage Application of PCT/EP2012/067164, filed on Sep. 4, 2012, which claims the benefit of priority to Serial No. DE 10 2011 085 629.3, filed on Nov. 2, 2011 in Germany, the disclosures of which are incorporated herein by reference in their entirety.

The present disclosure relates to electronic modules for vehicles. The present disclosure particularly relates to an electronic module for controlling a transmission or transmission part or a transmission component. The present disclosure further particularly relates to an electronic module for operation in a transmission, in particular at least partially in a transmission fluid, to a transmission having an electronic module according to the disclosure, and also to a vehicle.

BACKGROUND

By virtue of the continually advancing automation of vehicle functions and the provision of convenience functions, components which were previously operated in a purely mechanical manner are increasingly being provided with an electronic actuation means. Complex functional relationships and processes can therefore be performed by the control electronics in a manner which is transparent for a vehicle user, for example the driver.

For example, automatic transmissions in motor vehicles likewise use electronic modules and sensors for controlling and regulating the transmission function. Conventional electronic modules for controlling automatic transmissions in motor vehicles can be employed directly in the transmission and as a result have to be able to withstand high thermal and mechanical loading. Electronic modules of this kind also often come into direct contact with the transmission fluid, for example aggressive ATF oil (Automatic Transmission Fluid). Conventional electronic modules for use in transmissions therefore also likewise have to be designed to be able to repel said transmission fluid.

Known transmission control modules for automatic transmissions generally comprise an electronic module (iTCU—integrated Transmission Control Unit), possibly one or more EC (electronically commutated) motor controllers, and furthermore have sensors, plugs, electrical connection technology and also mechanical support structures and positioning elements.

Known electronic modules for operation in a transmission are usually realized using hermetically sealed steel housings, in particular in order to protect the electronics which are arranged in the housing from transmission fluid. An electrical connection technique, for example to form oil-tight sensors, is usually produced by means of stamped grids. Transmission control modules are usually designed in a very transmission- or customer-specific manner and are individually developed, in particular, for each transmission project, it being possible for this to be due solely to the geometry of an individual transmission. On account of this individual planning and manufacture, a module which is arranged in the transmission requires a high level of outlay on development and/or outlay on tools in order to be produced.

Electronic modules and/or electronic control means for transmissions can also be implemented as so-called printed circuit board controllers which can be arranged, for example, in the motor compartment instead of in the transmission itself. An electronic module of this kind, which is arranged outside a transmission, for example designed as a printed circuit board controller, is usually connected to a sensor system and an actuator system, which are located in the transmission, by means of a cable harness in this case. Owing to a simple individual configuration and planning of a cable harness for a vehicle, an electronic module or printed circuit board controller of this kind can be used for a plurality of, in particular different, transmission projects. Variance with respect to different transmissions is provided by means of the individual configurations of the cable harness in this case, it being possible to match this very easily to an individual transmission project.

An electronic module for existing transmission projects can, for example, also contain the actuation electronics system for an EC (electronically commutated) motor. A motor of this kind is used for driving an oil pump in the transmission and operates in a power range of currently 250 W to 800 W.

SUMMARY

One aspect of the present disclosure can therefore be considered that of providing an electronic module which is standardized on the outside but which can be individually configured to a high degree on the inside and, in particular, has the option of preferably being able to be connected to a heat sink in order to provide a sufficient degree of removal of heat from the electronic module, in this case primarily the iTCU and the EC motor controller.

Accordingly, an electronic module for a vehicle, in particular for controlling a transmission or a transmission function, a transmission for a vehicle, having an electronic module according to the disclosure, and also a vehicle having an electronic module according to the disclosure, and/or a transmission according to the disclosure are provided. Preferred refinements can be found in the claims.

The present disclosure therefore makes it possible to transfer the simple variant management of a printed circuit board controller to the electronic module which is arranged in the transmission. By suitably configuring the electronic module, for example the housing thereof, as a can housing for example, said housing can accommodate the integrated electronic controller and, for example, be connected by means of a screw connection directly to a further hydraulic controller of the automatic transmission or to a housing part of the transmission. Preferred removal of heat in comparison to known solutions and also increased flexibility in respect of the available installation space can be realized as a result.

In this case, a can housing can combine, in particular, a high degree of mechanical stability with a high capacity for spreading heat, with the result that the removal of heat from electronic components in the electronic module is improved. Improved removal of heat is preferred particularly in the case of EC motor controllers which can have substantially all of the electronic components and, in particular, also power electronics components in order to actuate an EC motor. Components of this type are, for example, the power section, for example a B6 bridge, bridge driver, voltage supply, LIN/CAN bus interface, microprocessor for commutation calculation, signal evaluation for sensors, for example Hall sensors, currents, voltages and polarity-reversal protection.

According to the disclosure, a can housing is used for this purpose. In this case, a can housing usually has a substantially planar bottom face which can preferably emit thermal energy to a further element. In the can housing, in particular on the bottom face, electronic components, which are arranged on a printed circuit board for example, are inserted into the can housing. These electronic components can be attached to the housing bottom by means of suitable thermal conduction means, for example a thermally conductive adhesive or the like, said housing bottom therefore realizing preferably thermal contact between the electronic components and the bottom of the can housing.

These electronic components can be attached to the housing bottom by means of suitable thermal conduction means, for example a thermally conductive adhesive or the like, said housing bottom therefore realizing preferably thermal contact between the electronic components and the bottom of the can housing.

In this case, that side which is situated opposite the bottom of the can housing has a opening of large area for inserting the components into the can housing. The inserted components are then particularly preferably encapsulated with a suitable encapsulation material, for example comprising a curing, electrically insulating and, in particular, ATF-resistant plastics composition.

Furthermore, connection elements which provide electrical connection to the electronic components which are located in the can housing project out of the casting compound. For preferred connection to a heat sink, a can housing can have one or more continuous openings which are generally routed from the open side to the closed bottom side and provide the receptacle for a fastening means, such as a screw element for example for screwing the can housing, by way of its flat lower side, to the heat sink. In this case, the openings have, for example, a cylindrical wall which is raised at the top, so that encapsulation material in the can housing cannot escape via the opening.

A preferred thermal connection of the can housing to a heat sink, and therefore removal of heat from the can housing and/or the electronic components located therein, can be realized by a screwing-on operation. In this case, the can bottom itself may spread the flow of heat over its entire area. A screw-on opening in the can housing makes it possible for a module according to the disclosure to be screwed directly to the heat sink, for example to a hydraulic controller in the transmission or to a housing part of the transmission.

A transmission controller can obtain control signals via a simple LIN or CAN bus connection, or else transmit control signals, for example, to an EC motor controller module. An EC motor then rotates in a desired direction at a desired rotation speed by corresponding actuation. In this case, the electronic components of an electronic module according to the disclosure can be realized by known technology, for example printed circuit board technology in SMT (surface mount technology).

Owing to the use and the installation in a metal can housing, a good thermal connection of the printed circuit board or individual electronic elements, such as transistors, for example MOSFET transistors, to the can bottom can be realized. A can bottom of suitable configuration can provide a good thermal spread in this case, for example have a thickness of 2 mm, as a result of which it ensures low thermal resistance and also a good connection to a heat sink.

The electronic components in the can housing, for example a populated printed circuit board of an EC motor controller, are inserted and/or adhesively bonded into the can housing and, as a result, a thermally conductive adhesive, for example, makes contact with the bottom of the can housing, so that preferred thermal conduction from the components of the printed circuit board to the can bottom is ensured. The can housing is then encapsulated with a suitable encapsulation material. The encapsulation material and the material of the can housing should, in particular, be insensitive to transmission fluid in this case. By encapsulating the printed circuit board and/or electronic components of the electronic module in the can housing, said printed circuit board and/or electronic components can be protected against damage and against media such as the transmission oil for example.

Connection of the electronic components is performed, for example, by connection elements which project out of the encapsulation material. In the case of EC motor controllers, two high-current pins by way of example are used for the supply voltage, three high-current pins are used for the connection of the EC motor, two logic pins are used for the connection to the LIN or CAN bus, and five pins are used for supplying sensors, for example the Hall sensors in the EC motor.

In addition to connection of electronic components in the can housing using pins, the present disclosure also makes provision, for example in the case of an iTCU, for a connection using flat ribbon cable plug connectors. To this end, the printed circuit board can have, for example, corresponding plug connectors in the can housing, said plug connectors likewise being encapsulated with the encapsulation material in the can housing, but being arranged in such a way that, after an encapsulation process, they still project out of the casting material in such a way as to allow single or repeated connection to suitable complementary flat ribbon cable plug connectors.

The electronic module can be integrated into the transmission control module by means of a simple, floating plastic holder. Connection of sensors, actuators, communication connections and power supply can be realized by means of known flat ribbon cable plug connections which can be easily plug-connected at least to the electronic module.

A transmission fluid is generally usually an insulating, therefore electrically non-conductive, fluid. However, said transmission oil can contain, under certain circumstances, metal particles which are produced by abrasion against the gear wheels and bearings in the transmission. Flat ribbon cable plug connections which are plug-connected to connection elements sufficiently shield the connection elements from small metal particles or metal chips which are located in the transmission oil in order to prevent a possible short-circuit to the connection elements owing to these metal chips. As an alternative, a covering element can be provided, it being possible for said covering element to cover connection elements which are designed as individual pin elements and in this way protect against contact with the metal elements which are located in the transmission oil.

A variance which may be required in the transmission itself can therefore be realized by individually configuring connected flat ribbon cables. The present disclosure therefore allows simple change management since, in particular, no highly automated production lines are required which can manufacture only a specific type of transmission control module in each case. Substantially identical electronic modules (iTCU/EC motor controller), which may be individually parameterized, can be used for various transmission projects, as a result of which scale effects can be realized and also a time-to-market can be drastically reduced.

BRIEF DESCRIPTION OF THE DRAWINGS

Embodiments of the disclosure are illustrated in the drawings and explained in greater detail in the following description.

In the drawings

BRIEF DESCRIPTION OF THE DRAWINGS

Figure 1A:
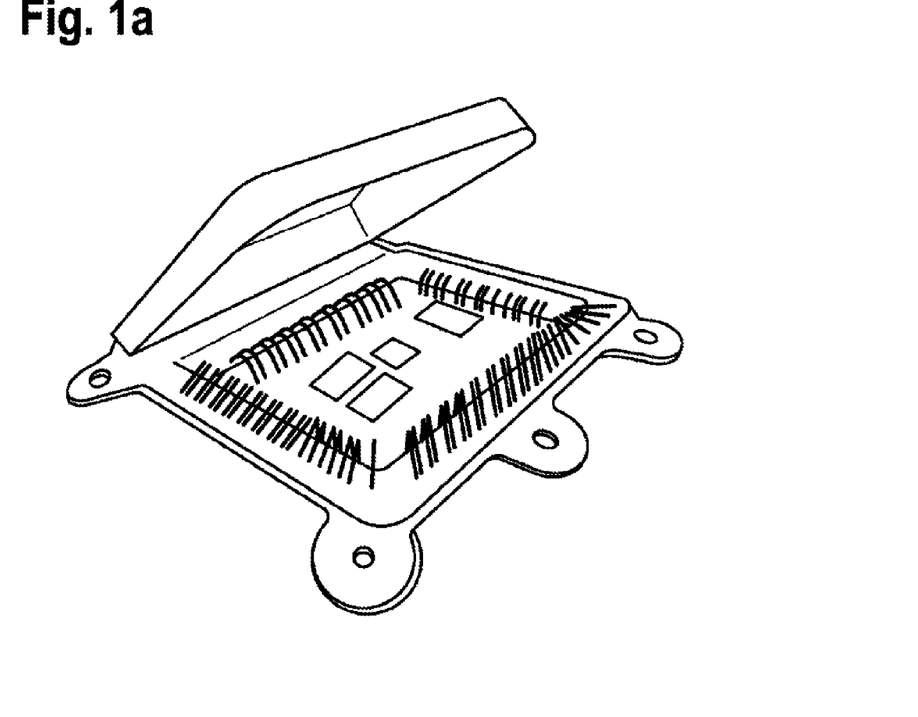
FIGS. 1a, b show exemplary housing forms of electronic modules.

FIG. 1a shows a known electronic module or transmission controller for installation into a transmission. In this case, the electronic module is, by way of example, designed as a micro-hybrid module with a ceramic printed circuit board, accommodated in a hermetically sealed steel housing and provided with steel pins as connection elements. In this case, the housing is preferably adapted to the special refinements of the stamped grid. Furthermore, the housing ensures sufficient removal of heat from the electronic module.

Figure 1B:
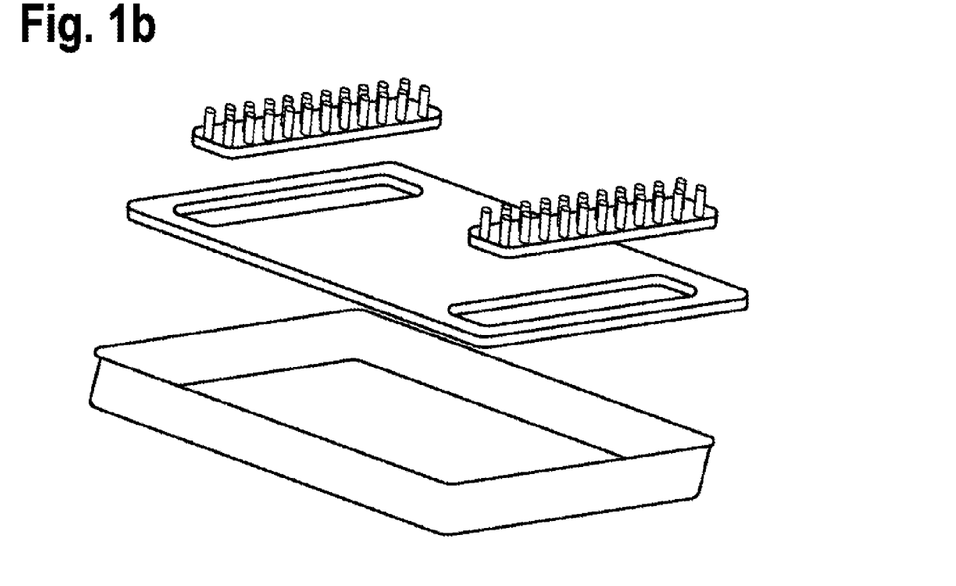

FIG. 1b shows a metal housing for an electronic module which can be electrically connected by means of inserted, integrated pin headers. In this case, the pins can be preferably gold-plated in order to provide corrosion protection against aggressive fluids.

Figure 1C:
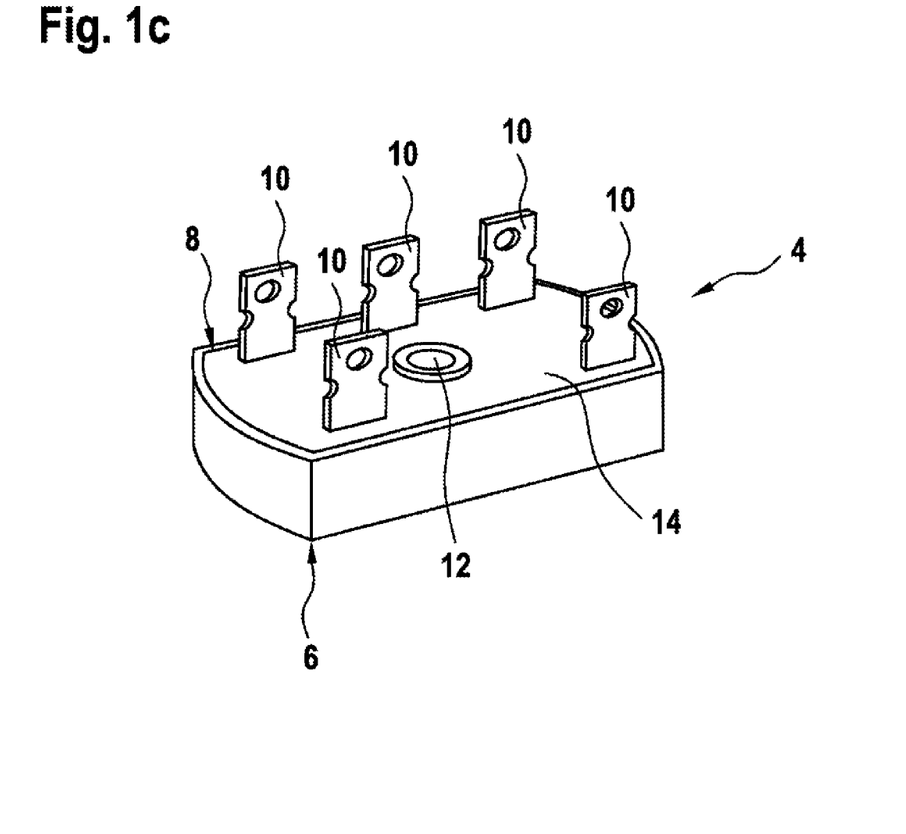
FIG. 1c shows an exemplary electronic module in a can housing.

FIG. 1c shows a can housing for illustrating the schematic design of the electronic modules according to the disclosure.

Can housing 4 has a bottom side 6 of large area which is suitable for emitting heat from the interior of the can housing 4 to a further component. Opening side 8, which provides substantially an opening of large area into the interior of the can housing 4, is situated opposite the bottom side 6. In FIG. 1c, a fastening opening 12, designed as a cylindrical metal opening with a circular cross section, is arranged in the center of the can housing 4 by way of example. In this case, fastening opening 12 is continuous and therefore allows a fastening means, for example a screw element, to be introduced, for example from the opening side 8, in the direction of the bottom side 6.

On the bottom side 6, the fastening means can again project out of the fastening opening 12 and engage, for example, in a suitable opening with a thread, and therefore fix, for example firmly screw, the can housing 4 to a further component. Preferred removal of heat from the can housing 4 by the screwed-on heat sink is possible by virtue of the bottom side 6 bearing on the screwed-on component over a large area.

An electronic system (not shown in FIG. 1c) is located in the interior of the housing 4 and is surrounded by an encapsulation material 14. In FIG. 1c, by way of example five connection elements 10 for making contact with the electronic system in the can housing 4 project out of the encapsulation material 14.

FIGS. 2a-d show an exemplary refinement of an electronic module with flat ribbon plug connections according to the present disclosure.

Figure 2A:
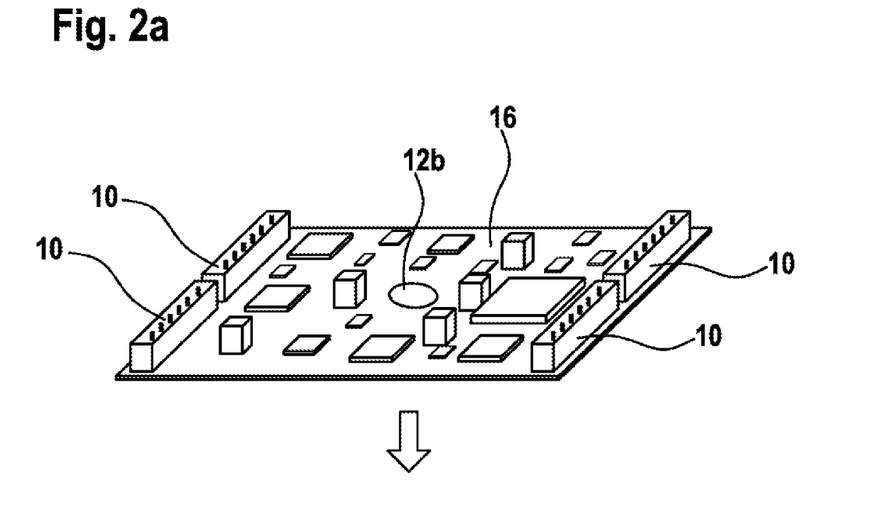
FIGS. 2a to d show exemplary refinements of an electronic module with flat ribbon plug connections according to the present disclosure.

FIG. 2a shows a circuit mount 16, by way of example a printed circuit board, with individual, discretely mounted electronic components.

Circuit mount 16 has, as connection elements 10, by way of example, flat ribbon connecting plugs which are suitably fastened, for example firmly soldered, to the circuit mount 16. Further electronic components can be mounted, for example, on the lower side (not shown in FIG. 2a) of the circuit mount 16. An opening 12b is provided in the circuit mount 16, said opening being suitable for accommodating the fastening opening 12 of can housing 4. In particular, the diameter of the fastening opening 12 of the can housing 4 is smaller than the diameter of opening 12b.

Figure 2B:
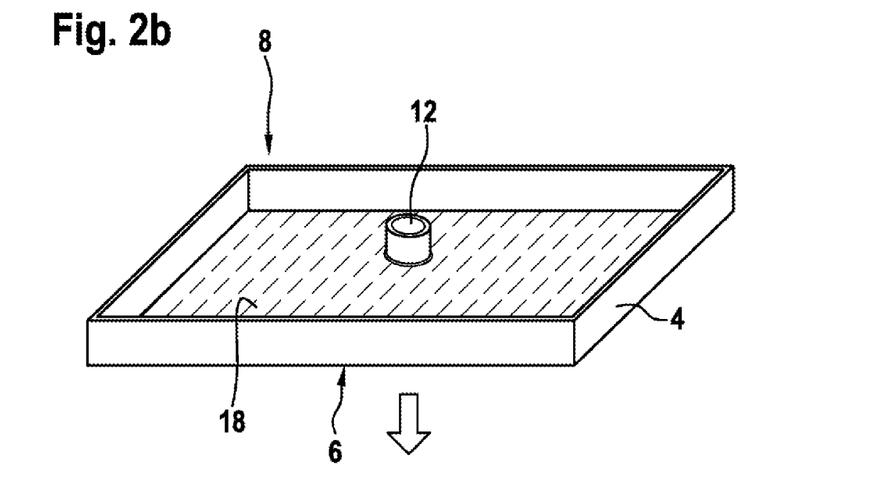

FIG. 2b shows the unfilled can housing 4. Adhesive material 18, by way of example in the form of thermally conductive adhesive material 18, is applied to the inside of the bottom side 6 of the can housing 4. Circuit mount 16 is inserted into the can housing 4 from the opening side 8 and is thermally conductively connected to said can housing, for example adhesively bonded to the inner bottom side of the can housing 4, using the adhesive material 18.

Figure 2C:
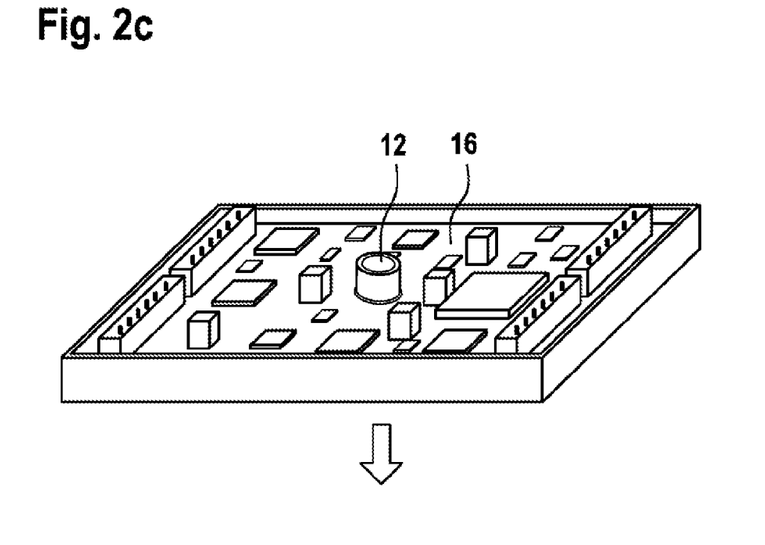

The corresponding arrangement of the circuit mount 16 which is inserted into the can housing 4 is shown in FIG. 2c. The top edge of the connection element 10 projects so far out of the can housing 4 or caps the top side of said can housing in such a way that the connection elements can still provide their connection function after said can housing is filled with encapsulation material 14.

Figure 2D:
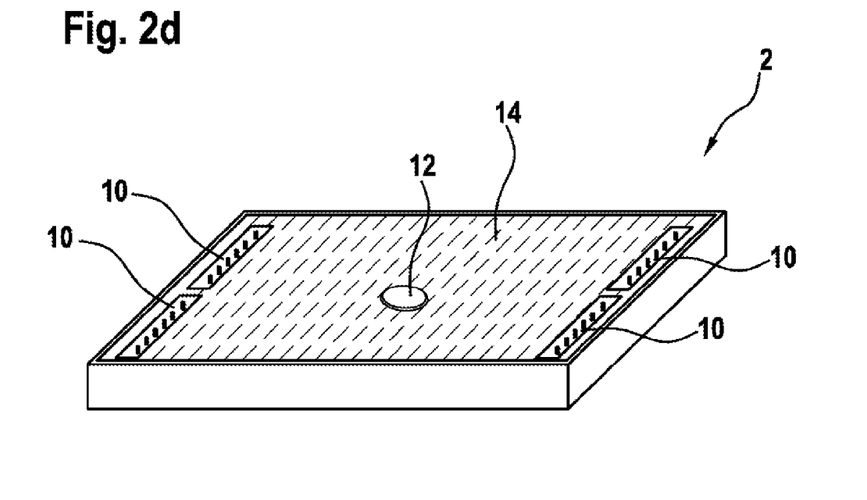

According to FIG. 2d, suitable encapsulation material 14 is then inserted into the can housing 4 by means of the opening side 8 and therefore traps circuit mount 16 in the can housing 4 in an electrically insulating manner. Only the connection elements 10 project out of the encapsulation material 14, as does the fastening opening 12. FIG. 2d therefore represents an electronic module 2 according to the disclosure which can be fastened and operated in a transmission at a suitable point.

Figure 3A:
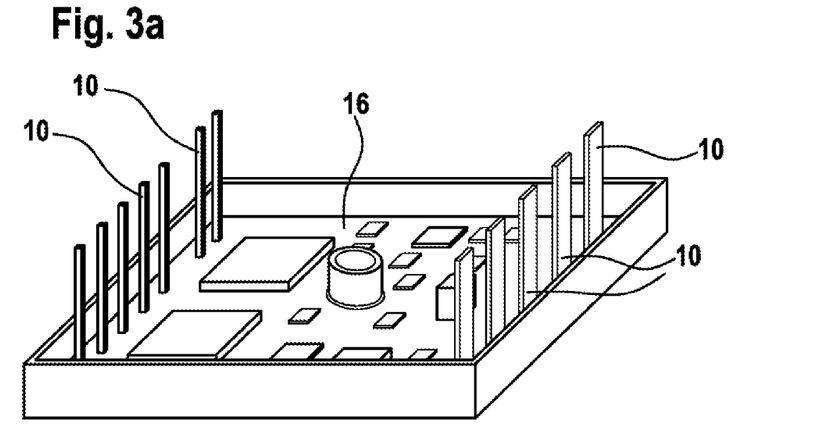
FIGS. 3a, b show further exemplary refinements of an electronic module according to the present disclosure.
Figure 3B:
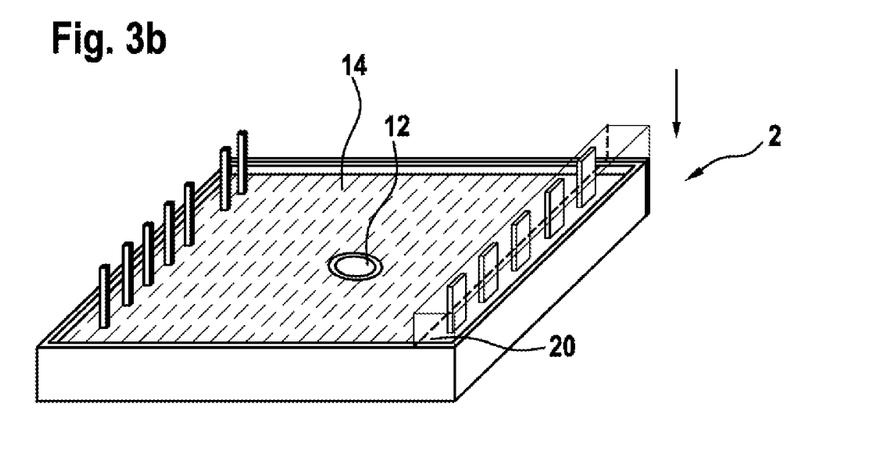

FIGS. 3a, b show further exemplary refinements of an electronic module according to the present disclosure.

The circuit mount 16, which is already inserted into the can housing 4, of FIG. 3a has, by way of example, a different arrangement of components and has connection elements 10 in the form of connection pins. Said connection elements are particularly suitable for welded or soldered connections. FIG. 3a can represent, for example, an EC motor controller module element.

An encapsulation process using casting material 14 produces an electronic module 2 according to the disclosure as a complete EC motor controller module according to FIG. 3b. The electronic module 2 is also suitable for operation in a transmission, in particular in a transmission fluid.

FIG. 3b schematically illustrates a covering element 20 which can cover the connection elements 10 which are designed as individual pin elements and in this way can protect against contact with metal elements which are located in the transmission oil.

Figure 4:
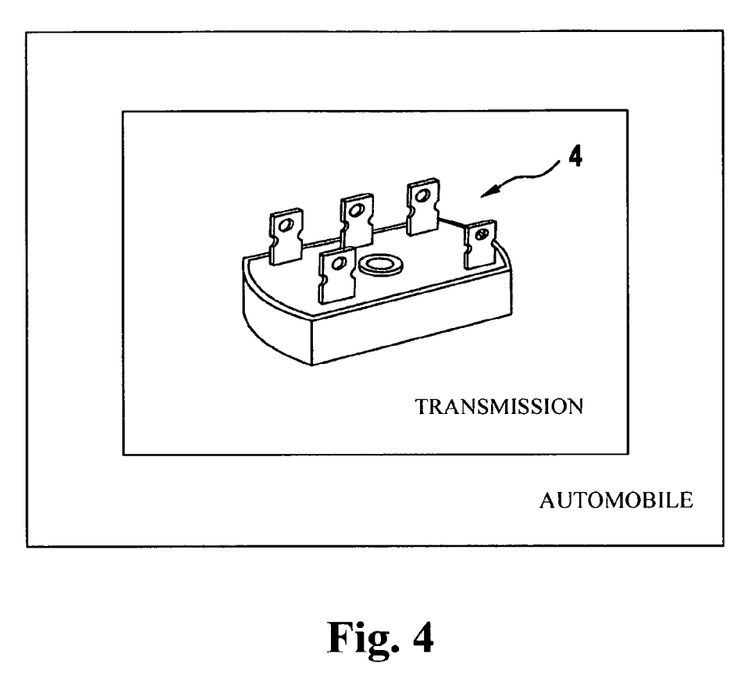
FIG. 4 shows the electronic module and corresponding can housing of FIG. 1c in a transmission of an automobile.

FIG. 4 depicts an exemplary electronic module, such as the electronic module and can housing of FIG. 1c, in a transmission of an automobile. In the exemplary embodiment shown in FIG. 4, the transmission and the automobile are illustrated as labeled representations.

The invention claimed is:

1. An electronic module for operation in a transmission of a vehicle, comprising:
  a unitary, one-piece metal can housing having a substantially planar bottom side and a completely closed side wall that extends from the bottom side, the side wall defining a single opening into the can housing that corresponds substantially to a bottom face of the bottom side and is situated opposite the bottom face; and
  a circuit mount having at least one connection element, the circuit mount positioned proximate to the bottom side through the opening into the can housing and encapsulated with an encapsulation material;

wherein the at least one connection element projects out of the encapsulation material and is configured to connect at least one conductive element;

wherein the electronic module is configured to be operated in transmission fluid; and wherein the can housing has a wall portion that defines a fastening opening configured to fasten the electronic module to a housing part of the vehicle transmission, the wall portion having a substantially cylindrical shape and extending through the circuit mount and the encapsulation material.

2. The electronic module as claimed in claim 1, wherein the at least one connection element is configured to connect a flat ribbon cable element.

3. The electronic module as claimed in claim 1, wherein the at least one connection element includes at least one connection pin for a welded or soldered connection.

4. The electronic module as claimed in claim 1, wherein the wall portion is completely closed and protrudes from the bottom side between the bottom side and the opening of the can housing.

5. The electronic module as claimed in claim 1, wherein the electronic module is configured to emit thermal energy to a housing part of a vehicle transmission in a fastened state.

6. A controller for a transmission of a vehicle, comprising:

an electronic module including:

a unitary, one-piece can housing having a substantially planar bottom side and a completely closed side wall that extends from the bottom side, the side wall defining a single opening into the can housing that corresponds substantially to a bottom face of the bottom side and is situated opposite the bottom face; and a circuit mount having at least one connection element, the circuit mount positioned proximate to the bottom side through the opening into the can housing and encapsulated with an encapsulation material;

wherein the at least one connection element projects out of the encapsulation material and is configured to connect at least one conductive element;

wherein the electronic module is configured to be operated in transmission fluid; and wherein the can housing has a wall portion that defines a fastening opening configured to fasten the electronic module to a housing part of the vehicle transmission, the wall portion having a substantially cylindrical shape and extending through the circuit mount and the encapsulation material.

7. A transmission for a vehicle, comprising:

an electronic module including:

a unitary, one-piece can housing having a substantially planar bottom side and a completely closed side wall that extends from the bottom side, the side wall defining a single opening into the can housing that corresponds substantially to a bottom face of the bottom side and is situated opposite the bottom face; and a circuit mount having at least one connection element, the circuit mount positioned proximate to the bottom side through the opening into the can housing and encapsulated with an encapsulation material;

wherein the at least one connection element projects out of the encapsulation material and is configured to connect at least one conductive element;

wherein the electronic module is configured to be operated in transmission fluid; and wherein the can housing has a wall portion that defines a fastening opening configured to fasten the electronic module to a housing part of the vehicle transmission, the wall portion having a substantially cylindrical shape and extending through the circuit mount and the encapsulation material.

8. The transmission as claimed in claim 7, wherein an automobile includes the transmission.

9. The transmission as claimed in claim 7, further comprising a controller configured to control the transmission, the controller including the electronic module.

* * * * *